United States Patent
Nishiura et al.

(10) Patent No.: US 7,737,043 B2
(45) Date of Patent: Jun. 15, 2010

(54) INSPECTION METHOD OF COMPOUND SEMICONDUCTOR SUBSTRATE, COMPOUND SEMICONDUCTOR SUBSTRATE, SURFACE TREATMENT METHOD OF COMPOUND SEMICONDUCTOR SUBSTRATE, AND METHOD OF PRODUCING COMPOUND SEMICONDUCTOR CRYSTAL

(75) Inventors: Takayuki Nishiura, Itami (JP); So Tanaka, Itami (JP); Yusuke Horie, Itami (JP); Kyoko Okita, Itami (JP); Takatoshi Okamoto, Toyonaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 478 days.

(21) Appl. No.: 11/798,675

(22) Filed: May 16, 2007

(65) Prior Publication Data

US 2007/0269989 A1 Nov. 22, 2007

(30) Foreign Application Priority Data

May 17, 1920 (JP) .............................. 2006-138015

(51) Int. Cl.
*H01L 21/302* (2006.01)
*H01L 21/461* (2006.01)
(52) U.S. Cl. ...................... 438/718; 438/704; 438/745; 438/692
(58) Field of Classification Search ................... 438/15, 438/758, 718, 483, 48, 704, 735, 738, 690, 438/745, 692
See application file for complete search history.

(56) References Cited

FOREIGN PATENT DOCUMENTS

| EP | 1 389 496 A1 | 2/2004 |
|---|---|---|
| EP | 1 763 071 A1 | 3/2007 |
| JP | 5-291371 | 11/1993 |
| JP | 7-201689 | 8/1995 |
| JP | 08-078492 | * 3/1996 |

(Continued)

OTHER PUBLICATIONS

Japanese Office Action, with English Translation, issued in Japanese Patent Application No. JP 2006-138015, mailed on May 7, 2008.

(Continued)

*Primary Examiner*—Chuong A. Luu
(74) *Attorney, Agent, or Firm*—McDermott Will & Emery LLP (57) ABSTRACT

There are provided an inspection method of a compound semiconductor substrate that can have the amount of impurities at the surface of the compound semiconductor substrate reduced, a compound semiconductor substrate, a surface treatment method of a compound semiconductor substrate, and a method of producing a compound semiconductor crystal. In the inspection method of the surface of the compound semiconductor substrate, the surface roughness Rms of the compound semiconductor substrate is measured using an atomic force microscope at the pitch of not more than 0.4 nm in a scope of not more than 0.2 μm square. The surface roughness Rms of the compound semiconductor substrate measured by the inspection method is not more than 0.2 nm.

13 Claims, 5 Drawing Sheets

FOREIGN PATENT DOCUMENTS

| | | | |
|---|---|---|---|
| JP | 10-150088 | | 6/1998 |
| JP | 2001-53011 | | 2/2001 |
| JP | 2001-053011 | * | 2/2001 |
| JP | 2003-86553 | | 3/2003 |
| JP | 2004-179638 | * | 6/2004 |
| JP | 2005-228848 | | 8/2005 |
| WO | WO 2006/001117 A1 | | 1/2006 |

OTHER PUBLICATIONS

Partial European Search Report issued in European Patent Application No. EP 07009633.4-1235/1858062, dated Jul. 1, 2008.

Sawafuji, Yutaka, "AlxGa1-xAs (111) A Substrate with Atomically Flat Polished Surface," Journal of the Electrochemical Society, vol. 146, No. 11, 1999. pp. 4253-4255.

* cited by examiner

INSPECTION METHOD OF COMPOUND SEMICONDUCTOR SUBSTRATE, COMPOUND SEMICONDUCTOR SUBSTRATE, SURFACE TREATMENT METHOD OF COMPOUND SEMICONDUCTOR SUBSTRATE, AND METHOD OF PRODUCING COMPOUND SEMICONDUCTOR CRYSTAL

BACKGROUND OF THE INVENTION

1. Field of the Invention

The present invention relates to an inspection method of a compound semiconductor substrate, a compound semiconductor substrate, a surface treatment method of a compound semiconductor substrate, and a method of producing a compound semiconductor crystal, directed to a compound semiconductor substrate having low surface roughness Rms.

2. Description of Related Art

A substrate formed of semiconductor is extensively employed in semiconductor lasers, LEDs (Light Emitting Diode), high-speed devices, and the like by virtue of the light-emitting property and high electron mobility rate. In general, surface treatment is executed to produce a substrate formed of a Group III-V compound semiconductor. For example, Japanese Patent Laying-Open No. 2001-53011 (Patent Document 1) discloses a compound semiconductor having the impurities at the interface between an epitaxial layer and a substrate reduced by optimizing three issues, i.e. the method of washing the substrate, the method of storing the substrate until epitaxial growth is executed, and the conditions for growth prior to initiating epitaxial growth. Patent Document 1 teaches that the oxygen concentration is set to not more than 10 ppm in the method of storage.

Japanese Patent Laying-Open No. 07-201689 (Patent Document 2) discloses a semiconductor wafer with a protection film, having an LB (Langmuir-Blodgett) film formed at the wafer surface. Patent Document 2 also teaches the method of obtaining a clean wafer surface by applying a polymer film on the LB film, and exfoliating the LB film by means of the polymer film.

Japanese Patent Laying-Open No. 05-291371 (Patent Document 3) discloses the method of evaluating the surface of InP semiconductor and interface for estimating the impurity concentration at the surface or interface, by forming a thin InGaAs epitaxial layer at an InP semiconductor substrate and detecting the carrier mobility or carrier concentration.

Japanese Patent Laying-Open No. 2003-86553 (Patent Document 4) discloses a semiconductor crystal wafer rinsed with deionized water at the water temperature of 15° C. or below immediately after polishing to reduce the haze level.

Although the compound semiconductor wafer of Patent Document 1 is stored with the oxygen concentration at 10 ppm or below, approximately $1 \times 10^{13}$ oxygen molecules per 1 cc are mixed in such a state. By the presence of such oxygen molecules, oxygen will be adsorbed at the surface of the wafer since the oxygen molecules will collide against the surface of the wafer in an extremely short time. Therefore, there is a problem that impurities at the surface will not be reduced in the substrate storage method disclosed in Patent Document 1.

The semiconductor wafer with a protection film disclosed in Patent Document 2 is produced based on the method of forming an LB film at the wafer surface. It is therefore difficult to completely remove all the atoms constituting the LB film in atomic order. There was a problem that surface-active agents and the like remain on the surface of the wafer. Further, the contact of the polymer film with the surface may cause contamination by particles from the polymer film per se. Additionally, particles or scratches may be generated when the polymer film is exfoliated after contact.

In the evaluation method of the InP semiconductor surface and interface disclosed in Patent Document 3, epitaxial growth must be executed for evaluation. Since the epitaxial layer obtained by epitaxial growth must be of extremely high accuracy, the cleanness of the epitaxial device must be always maintained. Thus, there was a problem that the cost is increased.

For the semiconductor crystal wafer disclosed in Patent Document 4, deionized water of low temperature must be supplied. This means that the deionized water device including an ultraviolet lamp and the like as the heat source must be maintained at a temperature lower than the room temperature. Thus, there is a problem that the cost is increased.

For the semiconductor crystal wafer disclosed in Patent Document 4, the haze level is measured using a mirror reflection type inspection device to obtain an epitaxial layer of high quality. However, the optical scheme allows the detection of only the average of the surface roughness Rms in a scope of an area extremely larger than the size of an atom. Further, the size of the atom is extremely small as compared to the wavelength of light. Therefore, there was a problem that the unevenness of the substrate surface cannot be detected in atomic order.

SUMMARY OF THE INVENTION

In view of the foregoing, an object of the present invention is to provide an inspection method of a compound semiconductor substrate that can have the amount of impurities at the surface of the compound semiconductor substrate reduced, a compound semiconductor substrate, a surface treatment method of a compound semiconductor substrate, and a method of producing a compound semiconductor crystal, directed to reducing the cost.

An inspection method of a compound semiconductor substrate of the present invention corresponds to an inspection method of the surface of a compound semiconductor substrate. The surface roughness Rms of the compound semiconductor substrate is measured using an atomic force microscope (AFM) at a pitch of not more than 0.4 nm in a scope of 0.2 μm square.

The inventors of the present invention diligently studied a method to inspect the amount of impurities present at the surface of a compound semiconductor substrate. They found an inspection method of a compound semiconductor substrate, having a correlation with the amount of impurities present at the surface of the compound semiconductor substrate. Specifically, the unevenness in the aspect of atomic order can be reliably detected by measuring the surface roughness Rms at a pitch of 0.4 nm at most, i.e. smaller than the size of two atoms, using an AFM. Epitaxial growth is executed on the semiconductor compound substrate having the surface roughness Rms measured by the AFM, and the interface between the epitaxial layer and the semiconductor compound substrate is subjected to SIMS (Secondary Ion Mass Spectrometer) analysis. It was found that impurities are less likely to adhere to the pits and projections at the surface when the unevenness in atomic order measured by the AFM is low. The cost can be reduced by using an AFM currently available. Thus, there can be provided an inspection method of a compound semiconductor substrate that can have the amount of impurities at the surface of the compound semiconductor substrate reduced, also directed to reducing the cost.

As used herein, "surface roughness Rms" is the value measured in accordance with JIS B0601.

A compound semiconductor substrate of the present invention has a surface roughness Rms of not more than 0.2 nm, measured by the inspection method of a compound semiconductor substrate set forth above.

In accordance with the compound semiconductor substrate of the present invention, the unevenness in atomic order at the surface of the compound semiconductor substrate can be reduced. Therefore, a substrate that can have impurity atoms such as the oxygen atoms and the like reduced sufficiently at the surface can be provided, without application of a heating process or the like for forming an epitaxial-growing layer at the surface, of the compound semiconductor substrate. Thus, the cost can be reduced, and the amount of impurities at the surface of the compound semiconductor substrate can be readily reduced.

The compound semiconductor substrate set forth above preferably includes at least one of GaAs (gallium arsenide), InP (indium phosphorus), GaN (gallium nitride), and InN (indium nitride).

Since the amount of impurities at the surface can be reduced, a crystal can be grown on a compound semiconductor substrate of high characteristics.

A surface treatment method of a compound semiconductor substrate according to an aspect of the present invention corresponds to a surface treatment method of a compound semiconductor substrate to obtain the compound semiconductor substrate set forth above, and includes: a step of preparing a compound semiconductor substrate (preparation step); a step of polishing the compound semiconductor substrate (polishing step); and a step of washing the compound semiconductor substrate using an acid solution including at least one of dilute hydrochloric acid, dilute sulfuric acid, dilute nitric acid, and organic acid (acid solution washing step), after the polishing step.

By the surface treatment method of a compound semiconductor substrate according to an aspect of the present invention, the unevenness in atomic order at the surface of the compound semiconductor substrate can be reduced by the acid washing step after the polishing step. Thus, a compound semiconductor substrate can be produced, allowing reduction in the amount of impurities at the surface, and reducing the cost.

Preferably in the surface treatment method of a compound semiconductor substrate set forth above, the step of washing using an acid solution (acid washing step) is executed with an oxidizing agent added to the acid solution. Accordingly, the rate of reducing the unevenness at the surface of the compound semiconductor substrate in the acid washing step can be improved.

Preferably in the surface treatment method of a compound semiconductor substrate set forth above, the surface treatment method further includes the step of washing the compound semiconductor substrate using an acid-mixed alkaline solution of at least 8.0 in pH, having acid ions added (alkaline washing step), prior to the step of washing using an acid solution (acid washing step).

By virtue of the acid ions, the unevenness at the surface of the compound semiconductor substrate can be reduced. Furthermore, foreign objects (microparticles) at the surface can be removed by setting the pH to at least 8.0. Therefore, a balance between the washing capability and prevention of asperity at the surface in atomic order can be established.

Preferably in the surface treatment method of a compound semiconductor substrate set forth above, the step of washing using an acid-mixed alkaline solution (acid-mixed alkaline washing step) is executed with an oxidizing agent added into the acid-mixed alkaline solution. Accordingly, the rate of reducing the surface unevenness of the compound semiconductor substrate in the acid-mixed alkaline washing step can be improved.

Preferably in the surface treatment method of a compound semiconductor substrate set forth above, the surface treatment method further includes the step of washing the compound semiconductor substrate using a diluted alkaline solution of at least 50 ppm and not more than 0.5% (corresponding to 5000 ppm) in concentration, and at least 8.5 in pH (diluted alkaline washing step), prior to the step of washing using an acid solution (acid washing step).

By the diluted alkaline solution, increase of the unevenness at the surface can be suppressed. Therefore, a balance between the washing capability and prevention of asperity in atomic order can be established.

Preferably, in the surface treatment method of a compound semiconductor substrate set forth above, the step of washing using a diluted alkaline solution (diluted alkaline washing step) is executed with an oxidizing agent added to the diluted alkaline solution. Accordingly, the rate of reducing the unevenness at the surface of the compound semiconductor substrate can be improved in the diluted alkaline washing step.

Preferably in the surface treatment method of a compound semiconductor substrate set forth above, the surface treatment method further includes the step of polishing or washing the compound semiconductor substrate using a reducing agent (reducing agent step), immediately after the step of polishing (polishing step). Accordingly, the action of chlorine, when included in the polishing agent used in the polishing step, can be stopped to suppress surface asperity.

Preferably in the surface treatment method of a compound semiconductor substrate set forth above, an alkaline aqueous solution or oxidizing agent aqueous solution of at least 8.5 and not more 10.0 in pH is employed as the reducing agent in the step of polishing or washing using a reducing agent (reducing agent step). Accordingly, the action of chlorine, when included in the abrasive used in the polishing step, can be stopped to suppress the surface asperity.

Preferably in the surface treatment method of a compound semiconductor substrate set forth above, the surface treatment method further includes the step of rinsing the compound semiconductor substrate using HF (Hydrogen Fluoride) or HF having hydrogen peroxide solution added (rinsing step), after the step of washing using an acid solution (acid washing step). Accordingly, impurities such as silicon present at the surface can be removed.

A surface treatment method of a compound semiconductor substrate according to another aspect of the present invention corresponds to a surface treatment method of a compound semiconductor substrate to obtain the compound semiconductor substrate set forth above, and includes: a step of preparing a compound semiconductor substrate (preparation step); a step of polishing the compound semiconductor substrate (polishing step); a step of polishing or washing the compound semiconductor substrate using a reducing agent (reducing agent step), immediately after the polishing step; and a step of washing the compound semiconductor substrate using an acid-mixed alkaline solution of at least 8.0 in pH, having acid ions added, after the step of polishing or washing using a reducing agent (reducing agent step).

According to the surface treatment method of a compound semiconductor substrate according to another aspect of the present invention, the surface asperity caused by the abrasive in the polishing step can be suppressed by the reducing agent step executed immediately after the polishing step. Further, the unevenness in atomic order at the surface of the compound semiconductor substrate can be further reduced by the acid-mixed alkaline washing step. Thus, a compound semiconductor substrate having the amount of impurities at the surface reduced, directed to reducing the cost, can be produced.

Preferably in the surface treatment method of a compound semiconductor substrate set forth above, the step of washing using an acid-mixed alkaline solution (acid-mixed alkaline washing step) is executed with an oxidizing agent added to the acid-mixed alkaline solution. Accordingly, the rate of reducing the unevenness at the surface of the compound semiconductor substrate in the acid-mixed alkaline solution step can be reduced.

A surface treatment method of a compound semiconductor substrate according to a further aspect of the present invention corresponds to a surface treatment method of a compound semiconductor substrate to obtain the compound semiconductor substrate set forth above, and includes: a step of preparing a compound semiconductor substrate (preparation step); a step of polishing the compound semiconductor substrate (polishing step); a step of polishing or washing the compound semiconductor substrate using a reducing agent (reducing agent step), immediately after the polishing step; and a step of washing, the compound semiconductor substrate using a diluted alkaline solution of at least 50 ppm and not more than 0.5% in concentration, and at least 8.5 in pH (diluted alkaline washing step), after the step of polishing or washing using a reducing agent (reducing agent step).

According to the surface treatment method of a compound semiconductor substrate in the further aspect of the present invention, the surface asperity caused by the abrasive in the polishing step can be suppressed by the reducing agent step immediately after the polishing step. In addition, the unevenness in atomic order at the surface of the compound semiconductor substrate can be further reduced by the diluted alkaline washing step. Therefore, a compound semiconductor substrate that can have the amount of impurities at the surface reduced, and also directed to reducing the cost, can be produced.

Preferably in the surface treatment method of a compound semiconductor substrate set forth above, the step of washing using a diluted alkaline solution (diluted alkaline washing step) is executed with an oxidizing agent added to the diluted alkaline solution. Accordingly, the rate of reducing the unevenness at the surface of the compound semiconductor substrate can improved in the diluted alkaline washing step.

A method of producing a compound semiconductor crystal of the present invention includes the step of executing the surface treatment method of a compound semiconductor substrate set forth above, and a step of growing, on the surface of the compound semiconductor substrate, a compound semiconductor crystal including at least one element constituting the compound semiconductor substrate, after the step of executing the surface treatment method (post-treatment step).

According to the method of producing a compound semiconductor crystal of the present invention, a compound semiconductor crystal is formed on the surface of a compound semiconductor substrate having the amount of impurities reduced by the reduction in unevenness in atomic order. Therefore, a compound semiconductor crystal of favorable crystallinity can be produced.

According to an inspection method of a compound semiconductor substrate of the present invention, the unevenness can be detected reliably in atomic order. Further, an existing AFM can be employed to reduce the cost. Therefore, a compound semiconductor substrate can be inspected, reducing the cost, and allowing the amount of impurities at the surface reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments and examples of the present invention will be described hereinafter with reference to the drawings. In the drawings, the same or corresponding elements have the same reference characters allotted, and description thereof will not be repeated.

First Embodiment

An inspection method of a compound semiconductor substrate according to a first embodiment of the present invention will be described hereinafter. This inspection method corresponds to an inspection method of the surface of a compound semiconductor substrate. The surface roughness Rms of a compound semiconductor substrate is measured using an atomic force microscope at a pitch of not more than 0.4 nm in a scope of 0.2 μm square.

First, a scope of not more than 0.2 μm square is selected at the surface of a compound semiconductor substrate. The scope is not more than 0.2 μm, preferably at least 0.05 μm and not more than 0.18 μm, and further preferably at least 0.1 μm and not more than 0.18 μm. Since the cycle of the surface roughness Rms at the compound semiconductor substrate is in the order of 2 nm for a short one, measurement at the pitch of 0.4 nm or below is required to capture reliably the unevenness. Using the AFM (Dimension 3000) of Veeco Instruments Inc., the scope is 0.2 μm when there are 512 lines, 512 samples per line, based on the finest sampling, at the pitch of 0.4 nm. If the scope exceeds 0.2 μm, the data will become inaccurate since unevenness of a short cycle cannot be detected during sampling. When the scope is set to 0.18 μm or below, measurement with the current measurement facility is allowed, based on sufficient number of samples for measurement. Therefore, the data accuracy is improved. Further, by setting the scope to at least 0.05 μm, the least number of samples required for measurement can be ensured. By setting the scope to at least 0.1 μm, the number of samples for measurement becomes sufficient to allow inspection of the surface of a compound semiconductor substrate.

Based on the scope set forth above, the surface roughness Rms of the compound semiconductor substrate is measured using an atomic force microscope (AFM) at a pitch of not more than 0.4 nm. The pitch is 0.4 nm at most, preferably at least 0.05 nm and not more than 0.4 nm, further preferably at least 0.1 nm and not more than 0.3 nm. If the pitch exceeds 0.4 nm, which is greater than the size of two atoms, the unevenness in atomic order at the surface of the compound semiconductor substrate cannot be measured adequately. By setting the pitch to 0.4 nm at most, the unevenness in atomic order at the surface of the compound semiconductor substrate can be measured adequately. By setting the pitch to 0.3 nm at most, the unevenness in atomic order at the surface of the compound semiconductor substrate can be measured further adequately. By setting the pitch to at least 0.05 nm, measurement is allowed based on a number of samples, not too excessive in number. By setting the pitch to at least 0.1 nm, measurement is facilitated, based on a number of samples, less not excessive in number. Conventionally, the method of inspecting the haze or the like at the surface of a compound semiconductor substrate was employed by measuring optically the visible light of diffused reflection from the surface. This conventional method is not appropriate to evaluate the unevenness in atomic order since a laser beam having a diameter significantly larger (order of hundred μm) as compared to an atom, and a wavelength that is at least 100 times the size of an atom (order of several hundred nm) is applied.

By a measurement carried out at the pitch of 0.39 nm in the scope of 0.2 μm square, the surface roughness of samples for 512 lines, 512 samples per line, i.e. the total of 262144 samples, are obtained. In the roughness curve of the samples, the surface roughness Rms is the value of the square root of the average of the square of the deviation from the average line to the curve of measurement. By the surface roughness Rms thus measured, the unevenness in atomic order at the surface of the compound semiconductor substrate can be measured.

At least one scope is selected in the center area at the surface of the compound semiconductor substrate. It is preferable to select 3 to 5 scopes, including the center area and the regions around the center area. The surface roughness Rms for the entire surface of the compound semiconductor substrate can be measured by taking at least three scopes. Accordingly, the total area of the surface of the compound semiconductor substrate can be inspected. Inspection can be carried out rapidly by selecting not more than five scopes.

The inspection method of a compound semiconductor substrate according to the first embodiment of the present invention corresponds to the inspection surface of the surface of a compound semiconductor substrate. The surface roughness Rms of a compound semiconductor substrate is measured using an atomic force microscope at a pitch of not more than 0.4 nm in a scope of not more than 0.2 μm square. By measuring the surface roughness Rms at a pitch of not more than 0.4 nm, i.e. a pitch smaller than the size of two atoms, using an AFM, the unevenness in atomic order can be detected reliably. Further, the cost will not be increased since an existing AFM can be used to measure the unevenness in atomic order at the surface of the compound semiconductor substrate. Upon evaluating the unevenness in atomic order measured according to this method and the amount of impurities at the interface between an epitaxial layer obtained by epitaxial growth and the compound semiconductor substrate by SIMS, it was found that there is a relationship between the unevenness in atomic order before epi growth and the impurities at the interface after epi growth. By this method, the cost can be reduced, and the amount of impurities at the interface between an epitaxial layer grown on a compound semiconductor substrate and the substrate can be reduced.

Second Embodiment

Compound semiconductor substrates according to a second embodiment of the present invention will be described hereinafter with reference to FIGS. 1A and 1B. A compound semiconductor substrate 10 and a compound semiconductor substrate 20 of FIGS. 1A and 1B, respectively, has the surface roughness Rms of not more than 0.2 nm, measured by the inspection method of a compound semiconductor substrate according to the first embodiment of the present invention.

Specifically, the surface roughness Rms at a surface 11 of compound semiconductor substrate 10/20 is not more than 0.2 nm, preferably not more than 0.18 nm, and more preferably at least 0.03 nm and not more than 0.15 nm. If the surface roughness Rms is greater than 0.2 nm, impurity atoms will readily be adsorbed at the pits and projections of surface 11, and less likely to be removed. Therefore, when an epitaxial layer is grown on surface 11, impurity atoms will remain even if heating or the like is executed prior to the epitaxial growth. These impurities will be introduced into the epitaxial layer, resulting in poor crystallinity. By setting the surface roughness Rms to not more than 0.18 nm, the unevenness at surface 11 in atomic order can be further reduced. Therefore, impurity atoms at surface 11 can be further reduced. The impurity atoms can be reduced further more by setting the surface roughness Rms to 0.15 nm or below. By setting the surface roughness Rms to at least 0.03 nm, the surface roughness Rms currently available can be obtained.

Figure 1A:
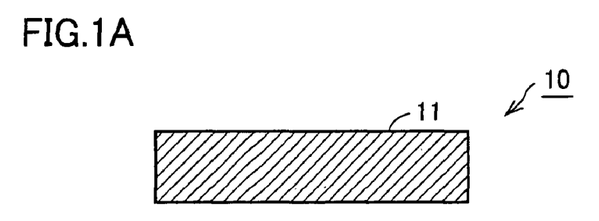
FIG. 1A is a schematic sectional view of a compound semiconductor substrate according to a second embodiment of the present invention.

Compound semiconductor substrate 10 is formed of, for example, one layer as shown in FIG. 1A. Compound semiconductor substrate 10 preferably includes at least one of GaAs, InP, GaN, and InN, and is preferably formed of at least one of GaAs, InP, GaN, and InN. The layer grown on surface 11 of compound semiconductor substrate 10 formed of such material can be used extensively for many applications.

Figure 1B:
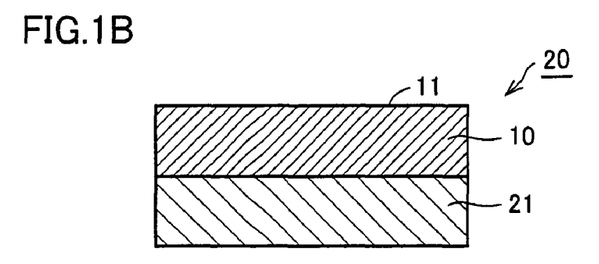
FIG. 1B is a schematic sectional view of another compound semiconductor substrate according to the second embodiment of the present invention.

Compound semiconductor substrate 20 is formed of two layers, i.e. a substrate 21 and a compound semiconductor substrate 10, as shown in FIG. 1B. Compound semiconductor substrate 10 is formed on substrate 21. In this case, substrate 21 and compound semiconductor substrate 10 may be formed of the same or different material.

The compound semiconductor substrate may be compound semiconductor substrate 10 formed of one layer, as shown in FIG. 1A, may be compound semiconductor substrate 20 on substrate 21, formed of the same or different material of compound semiconductor substrate 10, as shown in FIG. 1B, or a compound semiconductor substrate (not shown) formed of three or more layers.

The surface treatment method of a compound semiconductor substrate and a method of producing a compound semiconductor crystal according to the second embodiment of the present invention will be described hereinafter with reference to FIGS. 1A, 1B and 2.

Figure 2:
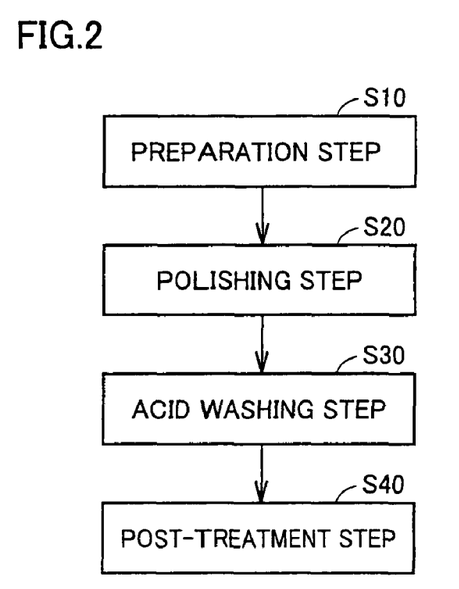
FIGS. 2 and 3 are flowcharts of a method of producing a compound semiconductor crystal according to second and third embodiments, respectively, of the present invention.

As shown in FIG. 2, in the surface treatment method of a compound semiconductor substrate of the second embodiment, first a step (S10) of preparing compound semiconductor substrate 10/20 is executed. In the preparation step (S10), compound semiconductor substrate 10/20, as shown in FIGS. 1A and 1B, is prepared. In the preparation step (S10), it is preferable to prepare compound semiconductor substrate 10/20 including at least one of GaAs, InP, GaN, and InN. It is further preferable to prepare compound semiconductor substrate 10/20 formed of at least one of GaAs, InP, GaN, and InN.

Then, it is preferable to execute a polishing step (S20) of polishing compound semiconductor substrate 10/20. In the polishing step (S20), polishing is effected such that the surface roughness Rms identified by the inspection method of a compound semiconductor substrate of the first embodiment is preferably not more than 0.3 nm, further preferably not more than 0.2 nm. By polishing the substrate to not more than 0.3 nm and executing the acid washing step (S30) that will be described afterwards, the surface roughness Rms of compound semiconductor substrate 10/20 can be set to not more than 0.2 nm, By polishing the surface to not more than 0.2 nm, the surface roughness Rms of compound semiconductor substrate 10/20 can be further reduced.

Specifically, in the polishing step (S20), a polishing agent including chlorine as an oxidizing agent is used. Therefore, washing or polishing is effected with deionized water immediately after polishing to suppress increase in surface roughness Rms.

In the polishing step (S20), it is preferable to employ a polishing agent including salt such as carbonate, sulfate, and phosphate, in addition to chlorine, from the standpoint of reducing surface roughness Rms at surface 11 of compound semiconductor substrate 10/20.

Then, following the polishing step (S20), an acid washing step (S30) of washing compound semiconductor substrate 10/20 using an acid solution formed of at least one of dilute hydrochloric acid, dilute sulfuric acid, dilute nitric acid, and organic acid is executed. In the acid washing step (S30), the unevenness in atomic order at surface 11 of compound semiconductor substrate 10/20 can be reduced by using an acid solution, so that surface roughness Rms measured by the inspection method of a compound semiconductor substrate of the first embodiment can be lowered to not more than 0.2 nm.

The acid solution employed in the acid washing step (S30) is at least one of dilute hydrochloric acid, dilute sulfuric acid, dilute nitric acid, and organic acid. For the organic acid, it is preferable to use formic acid, acetic acid, oxalic acid, lactic acid, malic acid, citric acid and the like, for example. The pH of the acid solution is preferably 0 to 4, further preferably 1 to 3. Preferably, the concentration of dilute hydrochloric acid is 0.001% to 0.5%, the concentration of dilute sulfuric acid is 0.001% to 0.5%, the concentration of dilute nitric acid is 0.001% to 0.5%, and the concentration of organic acid is 0.1% to 1%. By selecting an acid solution in this range, the surface roughness Rms of compound semiconductor substrate 10/20 can be further reduced.

The acid washing step (S30) is preferably carried out with an oxidizing agent added to the acid solution. The oxidizing agent is not particularly limited, and hydrogen peroxide solution, for example, can be employed. By washing surface 11 of compound semiconductor substrate 10/20 using an acid solution having an oxidizing agent added, the rate of the acid washing step (S30) can be improved. Although not particularly limited, the concentration of the oxidizing agent is preferably at least 5 ppm and not more than 1 mass %, further preferably at least 10 ppm and not more than 0.5 mass %. By setting the concentration of the oxidizing agent to at least 5 ppm, reduction in the washing capability of the acid solution can be suppressed. By setting the concentration of the oxidizing agent to not more than 1 mass %, reaction with oxides, organic materials, microparticles, or the like at surface 11 can be prevented.

The temperature of the acid solution employed in the acid washing step (S30) is not particularly limited, but is preferably the room temperature. By employing the room temperature, the facility for surface treatment of compound semiconductor substrate 10/20 can be simplified.

Although not particularly limited, the rinsing time period is preferably at least 10 seconds and not more than 300 seconds. By executing an acid washing step (S30) within this range, the expense for the acid solution can be reduced, allowing improvement in the productivity. Following washing, a deionized water rinsing step can be executed to remove the washing solution such as an acid or an alkaline solution. Further, in the deionized water rinsing step subsequent to the last washing step, moisture is removed from compound semiconductor substrate 10/20 by centrifugal drying. By applying ultrasonic waves of 900 to 2,000 kHz in the deionized water rinsing step, adherence of microparticles can be prevented. In order to prevent oxidation at the surface of compound semiconductor substrate 10/20, deionized water deaired to have an oxygen concentration of 100 ppb or below is used in the deionized water rinsing step. An explanation of any incidental step thereof will not be provided here.

With regards to compound semiconductor substrate 10/20 obtained by executing the steps set forth above (S10-S30), the surface treatment method wherein the surface roughness Rms measured by the method of the first embodiment of a compound semiconductor substrate is not more than 0.2 nm corresponds to the surface treatment method of a compound semiconductor substrate according to the second embodiment of the present invention.

Compound semiconductor substrate 10/20 undergoing the acid washing step (S30) is subjected to a post-treatment step (S40) of growing, on compound semiconductor substrate 10/20, a compound semiconductor crystal including at least one element constituting compound semiconductor substrate 10/20 on surface 11 of compound semiconductor substrate 10/20. The post-treatment step (S40) includes formation of a predetermined film by epitaxial growth, for example, on surface 11 of compound semiconductor substrate 10/20. It is preferable to form a plurality of devices. In this case, following formation of a predetermined structure on the surface of the compound semiconductor substrate, a dividing step such as dicing is executed to divide the compound semiconductor substrate into individual devices. Thus, a device with a compound semiconductor substrate can be obtained. Such a device is incorporated in a lead frame, for example. By executing a wire bonding step or the like, a semiconductor device employing such a device can be obtained.

According to compound semiconductor substrate 10/20 of the second embodiment, the surface roughness Rms measured by the inspection method of a compound semiconductor substrate of the first embodiment is not more than 0.2 nm. Since the unevenness in atomic order at surface 11 of compound semiconductor substrate 10/20 can be reduced, impurity atoms such as oxygen atoms at surface 11 can be reduced sufficiently. This eliminates the need of an extra heating process or the like in forming an epitaxial-grown layer on surface 11 of compound semiconductor substrate 10/20. Therefore, the cost can be reduced. In addition, the amount of impurities at the surface of compound semiconductor substrate can be reduced.

Compound semiconductor substrate 10/20 preferably includes at least one of GaAs, InP, GaN, and InN. Accordingly, a crystal can be grown on compound semiconductor substrate 10/20 of superior characteristics since the concentration of impurities that are readily adhered and not readily removed at surface 11 can be reduced.

The surface treatment method of compound semiconductor substrate 10/20 of the second embodiment of the present invention includes a preparation step (S10) of preparing compound semiconductor substrate 10/20, a polishing step (S20) of polishing compound semiconductor substrate 10/20, and an acid washing step (S30) of washing compound semiconductor substrate 10/20 using an acid solution formed of at least one of dilute hydrochloric acid, dilute sulfuric acid, dilute nitric acid, and organic acid, after the polishing step (S20). By the polishing step (S20), the surface roughness Rms of compound semiconductor substrate 10/20 is reduced. By the acid washing step (S30), the unevenness in atomic order at surface 11 of compound semiconductor substrate 10/20 can be reduced. Therefore, the surface roughness Rms of compound semiconductor substrate 10/20 can be set to not more than 0.2 nm. Therefore, compound semiconductor substrate 10/20 can be produced, allowing reduction in cost, and reduction in the amount of impurities at the surface of a compound semiconductor substrate.

The surface treatment method of a compound semiconductor substrate set forth above is preferably executed with an oxidizing agent added to the acid solution. Accordingly, the rate of reducing the unevenness at the surface of compound semiconductor substrate can be improved in the acid washing step (S30).

Third Embodiment

Figure 3:
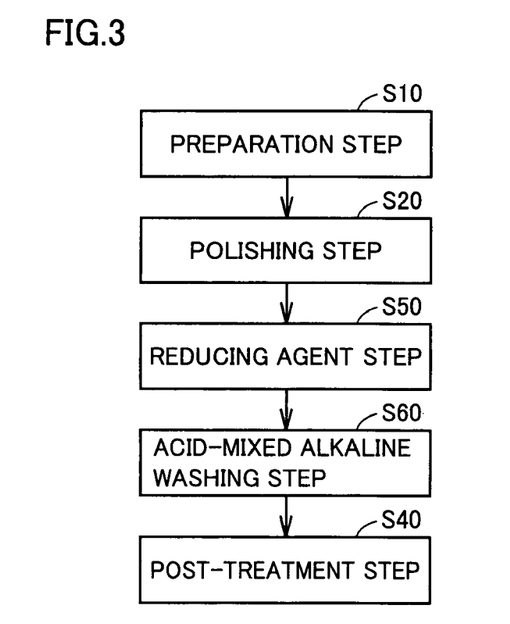

A surface treatment method of a compound semiconductor substrate according to a third embodiment of the present invention will be described hereinafter with reference to FIGS. 1A, 1B and FIG. 3. The compound semiconductor substrate obtained by the surface treatment method of the third embodiment is similar to the compound semiconductor substrate of the second embodiment shown in FIGS. 1A and 1B. FIG. 3 is a flowchart of the method of producing a compound semiconductor crystal according to the third embodiment of the present invention.

First, the preparation step (S10) of preparing compound semiconductor substrate 10/20 is executed. The preparation step (S10) is similar to that of the second embodiment, and description thereof will not be repeated.

Then, the polishing step (S20) of polishing compound semiconductor substrate 10/20 is executed. The polishing step (S20) is similar to that of the second embodiment, and description thereof will not be repeated.

Immediately after the polishing step (S20), a reducing agent step (S50) of polishing or washing compound semiconductor substrate 10/20 using a reducing agent is executed. In the reducing agent step (S50), the surface roughness Rms of compound semiconductor substrate 10/20 can be maintained low by stopping the action of the oxidizing agent such as chlorine included in the abrasive used in the polishing step (S20).

In the reducing agent step (S50), an alkaline aqueous solution or an oxidizing agent aqueous solution of at least 8.5 and not more than 10.0 in pH is preferably used as the reducing agent.

Although not particularly limited, sodium thiosulfate, boron potassium hydroxide, urea, or the like is preferably used as the reducing agent. Although not particularly limited, the concentration of the reducing agent is preferably at least 0.5% and not more than 5%, more preferably at least 1% and not more than 3%. Although not particularly limited, the period of time for polishing or washing is preferably at least 5 seconds and not more than 3 minutes. Further, an acid, alkali, salt thereof, and an oxidizing agent can be employed for the reducing agent. For example, hydrocarbon ammonia (amine), hydrazine, hydrochloric acid, carboxylic acid such as oxalic acid and L-ascorbic acid, L-ascorbic acid sodium, sodium hydrogen sulfide, salt such as hypo-phosphite and EDTA, an oxidizing agent such as hydrogen peroxide, and the like an be used.

By using an alkaline aqueous solution of at least 8.5 and not more than 10.0 in pH as the reducing agent used in the reducing agent step (S50), the surface roughness Rms of compound semiconductor substrate 10/20 can be maintained low by virtue of stopping the action of the oxidizing agent such as chlorine included in the polishing agent employed in the polishing step (S20), and reducing the polishing rate in the polishing step (S20).

Although not particularly limited, it is preferable to use amine (organic alkali) such as aqueous ammonia, tetramethyl ammonium hydroxide (TMAH), from the standpoint of purity, for the alkaline aqueous solution.

The pH of the alkaline aqueous solution is at least 8.5 and not more than 10.0, preferably at least 8.5 and not more than 9.0, and further preferably at least 8.7 and not more than 8.9. By setting the pH to at least 8.5, the action of the abrasive used in the polishing step (S20) can be stopped more rapidly. By setting the pH to at least 8.7, the action of the abrasive employed in the polishing step (S20) can be stopped further rapidly. By setting the pH to not more than 10.0, deterioration of the unevenness at surface 11 of compound semiconductor substrate in atomic order is reduced. By setting the pH to not more than 9.0, deterioration at surface 11 in atomic order is further reduced. By setting the pH to not more than 8.9, deterioration of the unevenness at surface 11 in atomic order can be all the more reduced. The polishing time period in the reducing agent step (S50) using an alkaline aqueous solution as the reducing agent is preferably at least 10 seconds and not more than 3 minutes.

The method of executing the reducing agent step (S50) suitably includes the process of changing the abrasive to a reducing agent for polishing in a short period of time, immediately after the polishing step (S20), or spraying a reducing agent immediately after the polishing step (S20).

In the reducing agent step (S50), polishing or washing may be executed using one single or a plurality of reducing agents.

After the polishing step (S20), an acid-mixed alkaline washing step (S60) of washing compound semiconductor substrate 10/20 using an acid-mixed alkaline solution of at least 8.0 in pH, having acid ions added, is executed. In the acid-mixed alkaline washing step (S60), the unevenness in atomic order at surface 11 of compound semiconductor substrate 10/20 is reduced using an alkaline solution to set the surface roughness Rms measured by the inspection method of a compound semiconductor substrate of the first embodiment to not more than 0.2 nm.

The alkaline solution used in the acid-mixed alkaline washing step (S60) is at least 8.0, preferably at least 8.5, and more preferably at least 9.0 in pH. If the pH is set lower than 8.0, it will become difficult to remove the microparticles adhering to surface 11 of compound semiconductor substrate 10/20. By setting the pH to at least 8.5, the microparticles adhering to surface 11 can be removed. By setting the pH to at least 9.0, the microparticles adhering to surface 11 can be further removed.

The acid-mixed alkaline solution is not particularly limited as long as the pH is at least 8.0 under the state where acid ions are added. However, the acid-mixed alkaline solution preferably includes one selected from a washing liquid group consisting of sodium hydroxide (NaOH) aqueous solution, potassium hydroxide (KOH) aqueous solution, aqueous ammonia, and amines to facilitate removal of microparticles at surface 11.

Although not particularly limited, the acid ions added to the acid-mixed alkaline solution includes, for example, sulfuric acid ions, hydrofluoric acid ions, hydrochloric acid ions, nitric acid ions, acetic acid ions, and other organic acid ions. By adding acid ions, increase of the surface roughness Rms at surface 11 of compound semiconductor substrate 10/20 can be suppressed.

The acid-mixed alkaline washing step (S60) is preferably executed with an oxidizing agent added to the acid-mixed alkaline solution. Although not particularly limited, the oxidizing agent can include hydrogen peroxide solution or the like. By washing surface 11 of compound semiconductor substrate 10/20 using an alkaline solution having an oxidizing agent added, the rate of the acid-mixed alkaline washing step (S60) can be increased. Although not particularly limited, the concentration of the oxidizing agent is preferably at least 5 ppm and not more than 1 mass %, more preferably at least 50 ppm and not more than 0.5 mass %. By setting the concentration of the oxidizing agent to at least 5 ppm, reduction in the washing capability of the acid-mixed alkaline solution can be suppressed. By setting the concentration of the oxidizing agent to not more than 1 mass %, reaction with the oxides, organic matters, microparticles, or the like at surface 11 can be prevented.

Although not particularly limited, the temperature of the acid-mixed alkaline solution used in the acid-mixed alkaline washing step (S60) is preferably the room temperature. By virtue of the room temperature, the facility for the surface treatment of the compound semiconductor substrate can be simplified.

Although not particularly limited, the rinsing time period is preferably at least 10 seconds and not more than 300 seconds. By executing the acid-mixed alkaline washing step (S60) within this range, the expense for the acid-mixed alkaline solution can be reduced. Furthermore, the productivity can be improved.

Figure 4:
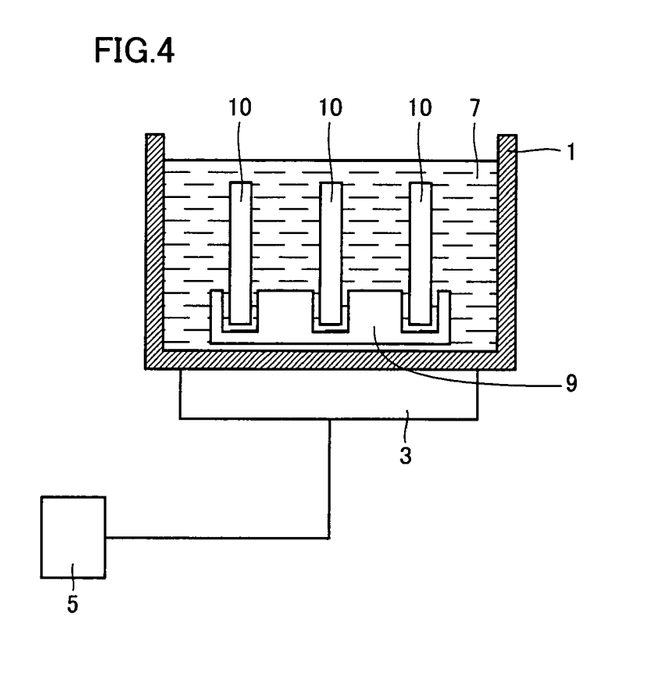
FIG. 4 is a schematic sectional view of a treatment device employed in an acid-mixed alkaline washing step.

In the acid-mixed alkaline washing step (S60), ultrasonic waves are preferably applied to the alkaline aqueous solution. Specifically, the washing liquid is vibrated (or shaken) using the ultrasonic device, as shown in FIG. 4. FIG. 4 is a schematic sectional view of the treatment device employed in the acid-mixed alkaline washing step. The effect can be improved by using ultrasonic waves of 900 to 2,000 kHz in frequency.

Referring to FIG. 4, the treatment device includes a washing tub 1 to hold washing liquid 7 as the rinse agent, an ultrasonic generation transducer 3 disposed at the bottom of washing tub 1, and a control unit 7 connected to ultrasonic generation transducer 3 to control the same. Washing liquid 7 is stored in washing tub 1. A holder 9 to hold a plurality of compound semiconductor substrates 10 is dipped in washing liquid 7. The plurality of compound semiconductor substrates 10 that is the rinsing subject are held by holder 9. Ultrasonic generation transducer 3 is located at the bottom of washing tub 1.

When compound semiconductor substrate 10 is to be washed in the acid-mixed alkaline washing step (S60), predetermined washing liquid 7 is provided in washing tub 1, as shown in FIG. 4, and holder 9 together with compound semiconductor substrates 10 is dipped in washing liquid 7. Thus, the surface of compound semiconductor substrate 10 can be washed with washing liquid 7.

At this stage, ultrasonic waves can be generated by ultrasonic generation transducer 3 under control of control unit 5. Accordingly, ultrasonic waves are applied to washing liquid 7. In response, washing liquid 7 is vibrated to improve the effect of removing microparticles from compound semiconductor substrates 10. Further, by placing washing tub 1 on a shakable member such as an XY stage and moving the member in an oscillating manner, washing tub 1 is shaken to allow stirring (shaking) of washing liquid 7 therein. Alternatively, holder 9 together with compound semiconductor substrates 10 may be moved back and forth manually to allow stirring (shaking) of washing liquid 7. This is advantageous in removing impurities and/or microparticles from compound semiconductor substrate 10, similar to the application of ultrasonic waves.

Washing liquid 7 in the treatment device is an acid-mixed alkaline solution. Further, compound semiconductor substrate 10 may be compound semiconductor substrate 20.

The post-treatment step (S40) of growing, on surface 11 of compound semiconductor substrate 10/20, a compound semiconductor crystal (including at least one element constituting compound semiconductor substrate 10/20) is executed with respect to compound semiconductor substrate 10/20 undergoing the acid-mixed alkaline washing step (S60). The post-treatment step (S40) is similar to that of the second embodiment, and description thereof will not be repeated.

The surface treatment method of compound semiconductor substrate 10/20 according to the third embodiment of the present invention includes a preparation step (S10) of preparing compound semiconductor substrate 10/20, a polishing step (S20) of polishing compound semiconductor substrate 10/20, a reducing agent step (S50) of polishing or washing compound semiconductor substrate 10/20 using a reducing agent, immediately after the polishing step (S20), and a acid-mixed alkaline washing step (S60) of washing compound semiconductor substrate 10/20 using an acid-mixed alkaline solution of at least 8.0 in pH, having acid ions added, after the reducing agent step (S50). By the polishing step (S20), the surface roughness Rms of compound semiconductor substrate 10/20 is reduced. By the reducing agent step (S50), the surface asperity caused by the abrasive in the polishing step (S20) can be suppressed. By the acid-mixed alkaline washing step (S60), foreign objects (microparticles) adhering to surface 11 can be removed with the acid-mixed alkaline solution, and the unevenness at surface 11 in atomic order can be removed with the acid ions. In other words, in the acid-mixed alkaline washing step (S60), a balance between the washing capability and prevention of surface asperity caused by the acid-mixed alkaline solution can established. Therefore, the unevenness in atomic order at surface 11 of compound semiconductor substrate 10/20 can be further reduced to allow further reduction of the amount of impurities at the surface of compound semiconductor substrate 10/20.

Preferably in the surface treatment method of compound semiconductor substrate 10/20 set forth above, the acid-mixed alkaline washing step (S60) is executed with an oxidizing agent added to the acid-mixed alkaline solution. Accordingly, the rate of reducing the unevenness at the surface of compound semiconductor substrate 10/20 in the acid-mixed alkaline washing step (S60) can be improved.

Fourth Embodiment

Figure 5:
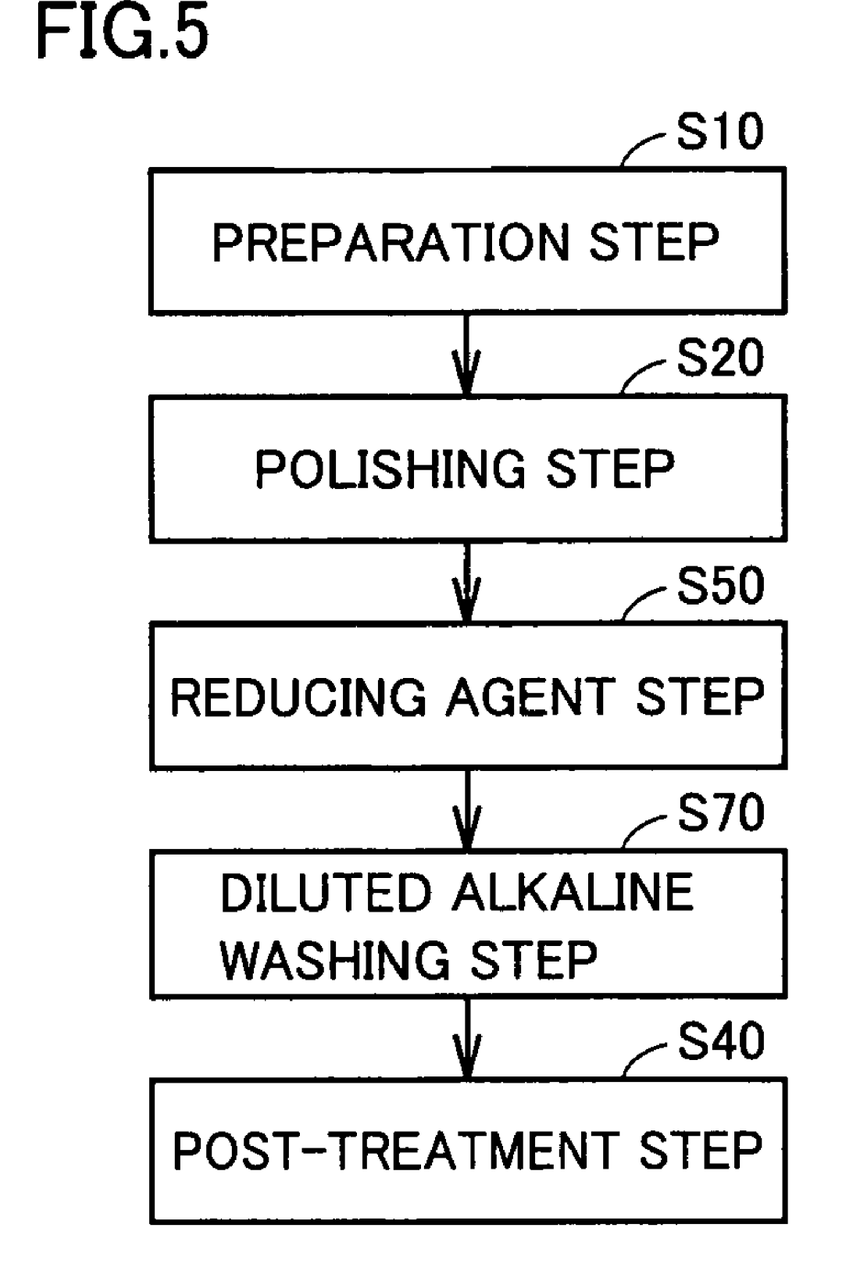
FIGS. 5 and 6 are flowcharts of a method of producing a compound semiconductor crystal according to fourth and fifth embodiments, respectively, of the present invention.

A surface treatment method of a compound semiconductor substrate according to a fourth embodiment of the present invention will be described hereinafter with reference to FIGS. 1A and 1B, and FIG. 5. The compound semiconductor substrate obtained by the surface treatment method of the fourth embodiment is similar to the compound semiconductor substrate of the second embodiment shown in FIGS. 1A and 1B.

First, a preparation step (S10) of preparing compound semiconductor substrate 10/20 is executed. The preparation step (S10) is similar to that of the second embodiment, and description thereof will not be repeated.

Then, a polishing step (S20) of polishing compound semiconductor substrate 10/20 is executed. The polishing step (S20) is similar to that of the second embodiment, and description thereof will not be repeated.

Next, a reducing agent step (S50) of polishing or washing compound semiconductor substrate 10/20 using a reducing agent is executed immediately after the polishing step. The reducing agent step (S50) is similar to that of the third embodiment, and description thereof will not be repeated.

After the reducing agent step (S50), a diluted alkaline washing step (S70) of washing compound semiconductor substrate 10/20 using a diluted alkaline solution having a concentration of at least 50 ppm and not more than 0.5%, and at least 8.5 in pH, is executed. In the diluted alkaline washing step (S70), the unevenness in atomic order at surface 11 of compound semiconductor substrate 10/20 is reduced using a diluted alkaline solution to set the surface roughness Rms measured by the inspection method of a compound semiconductor substrate of the first embodiment to not more than 0.2 nm.

The concentration of the diluted alkaline solution used in the diluted alkaline washing step (S70) is preferably at least 50 ppm and not more than 0.5%, preferably at least 100 ppm and not more than 0.3%. If the impurity concentration is set lower than 50 ppm, the washing capability of the diluted alkaline solution is reduced. By setting the concentration to at least 100 ppm, the washing capability of the diluted alkaline solution is improved. If the concentration is set higher than 0.5%, reaction with microparticles or the like at surface 11 will occur. The reaction with microparticles at surface 11 can be suppressed by setting the concentration to not more than 0.3%.

The pH of the diluted alkaline solution used in the diluted alkaline washing step (S70) is at least 8.5, preferably at least 8.7 and not more than 12.0, more preferably at least 8.8 and not more than 11.0. If the pH is set below 8.5, it will be difficult to remove microparticles adhering to surface 11 of compound semiconductor substrate 10/20. By setting the pH to at least 8.7, microparticles adhering to surface 11 can be removed. The microparticles adhering to surface 11 can be further removed by setting the pH to at least 8.8. By setting the pH to not more than 12.0, the surface asperity can be reduced. This is because the progress of the surface asperity can be substantially stopped by setting the pH to not more than 11.0.

The diluted alkaline solution is not particularly limited, as long as the concentration is at least 50 ppm and not more than 0.5%, and the pH is at least 8.5. In view of facilitating removal of microparticles from surface 11, the diluted alkaline solution preferably includes one selected from the group of a washing liquid consisting of ethyl hydroxyl amine, 2-etoxy-ethylamine, triethanolamine, diethanolamine, ethylamine, trimethylamine, diethylamine, dimethylamine, ethanolamine, trimethyl ammonium hydroxide, tetraethyl ammonium hydroxide, and tetramethyl ammonium hydroxide.

The diluted alkaline washing step (S70) is preferably executed with an oxidizing agent added to the diluted alkaline solution. Although not particularly limited, hydrogen peroxide solution, for example, can be used for the oxidizing agent. By washing surface 11 of compound semiconductor substrate 10/20 using the diluted alkaline solution having an oxidizing agent added, the rate of the diluted alkaline washing step (S70) can be improved. Although not particularly limited, the concentration of the oxidizing agent is preferably at least 5 ppm and not more than 1 mass %, more preferably at least 50 ppm and not more than 0.5 mass %. By setting the concentration of the oxidizing agent to at least 5 ppm, reduction in the washing capability of the diluted alkaline solution can be suppressed. By setting the concentration of the oxidizing agent to not more than 1 mass %, reaction with the oxides, organic matters, and/or microparticles at surface 11 can be prevented.

Although not particularly limited, the temperature of the diluted alkaline solution used in the diluted alkaline washing step (S70) is preferably the room temperature. By corresponding to the room temperature, the facility for surface treatment of compound semiconductor substrate 10/20 can be simplified.

Although not particularly limited, the rinsing time period is preferably at least 10 seconds and not more than 300 seconds. By a executing the diluted alkaline washing step (S70) within this range, the expense for the diluted alkaline solution can be reduced. Further, the productivity can be improved.

Application of ultrasonic waves of 900-2000 kHz in the diluted alkaline washing step (S70) is advantageous in removing microparticles adhering to surface 11 of compound semiconductor substrate 10/20. It is also preferable to execute a deionized water rinsing step after the diluted alkaline washing step (S70). The deionized water used in the deionized water rinsing step preferably has the dissolved oxygen of not more than 100 ppb. Further, moisture must be blown away through centrifugal drying or the like after the deionized water rinsing step.

Then, a post-treatment step (S40) of growing, on surface 11 of compound semiconductor substrate, a compound semiconductor crystal including at least one element constituting compound semiconductor substrate 10/20 is executed on compound semiconductor substrate 10/20 undergoing the diluted alkaline washing step (S70). The post-treatment step (S40) is similar to that of the second embodiment, and description thereof will not be repeated.

The surface treatment method of a compound semiconductor substrate of the fourth embodiment includes a preparation step (S10) of preparing compound semiconductor substrate 10/20, a polishing step (S20) of polishing compound semiconductor substrate 10/20, a reducing agent step (S50) of polishing or washing compound semiconductor substrate 10/20 using a reducing agent immediately after the polishing step (S20), and a diluted alkaline washing step (S70) of washing compound semiconductor substrate 10/20 using a diluted alkaline solution of at least 50 ppm and not more than 0.5% in concentration and at least 8.5 in pH, after the reducing agent step (S50). By the polishing step (S20), the surface roughness Rms of compound semiconductor substrate 10/20 is reduced. By the reducing agent step (S50), the surface asperity caused by the abrasive in the polishing step (S20) is suppressed. By the diluted alkaline washing step (S70), foreign objects (microparticles) adhering to surface 11 can be removed by the diluted alkaline solution. In other words, in the diluted alkaline washing step (S70), a balance between the washing capability and prevention of surface asperity caused by the diluted alkaline solution can be established. Therefore, the unevenness in atomic order at surface 11 of compound semiconductor substrate 10/20 can be further reduced to further reduce the amount of impurities at the surface of the compound semiconductor substrate.

Preferably in the surface treatment method of compound semiconductor substrate 10/20 set forth above, the diluted alkaline washing step (S70) is executed with an oxidizing agent added to the diluted alkaline solution. Accordingly, the rate of reducing unevenness at the surface of compound semiconductor substrate can be improved in the diluted alkaline washing step (S70).

Fifth Embodiment

Figure 6:
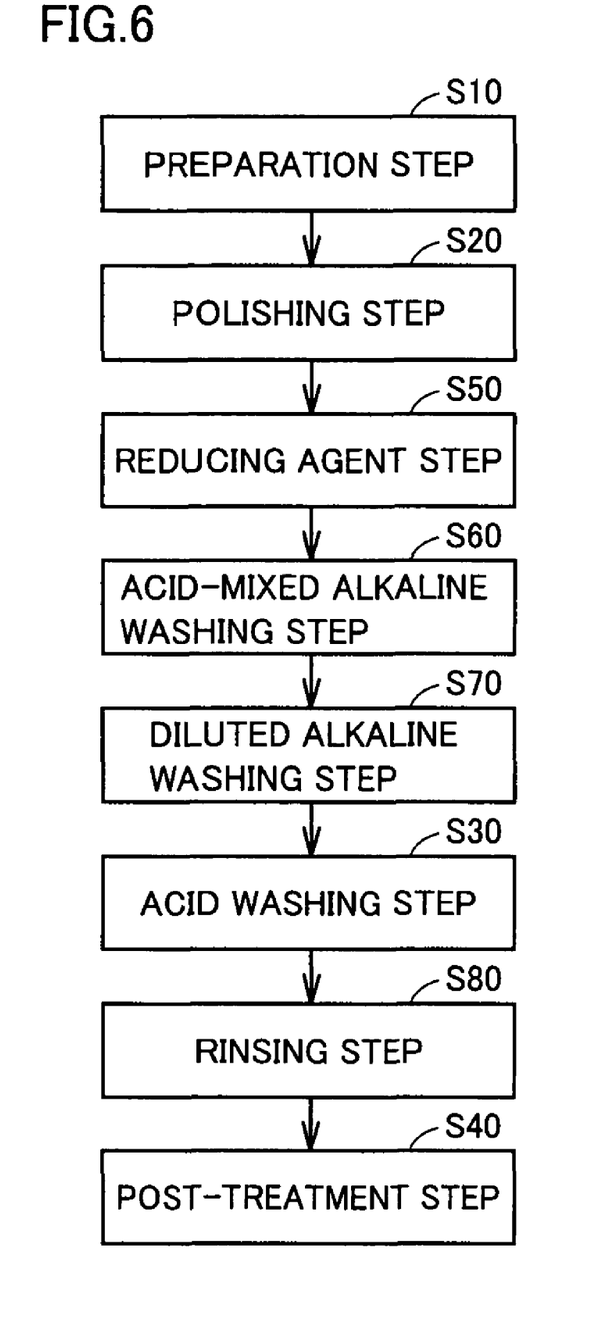

A surface treatment method of a compound semiconductor substrate according to a fifth embodiment of the present invention will be described hereinafter with reference to FIGS. 1A and 1B, and FIG. 6. The compound semiconductor substrate obtained by the surface treatment method of the compound semiconductor substrate of the fifth embodiment is similar to the compound semiconductor substrate of the second embodiment shown in FIGS. 1A and 1B.

First, a preparation step (S10) of preparing compound semiconductor substrate 10/20 is executed. The preparation step (S10) is similar to that of the second embodiment, and description thereof will not be repeated.

Then, a polishing step (S20) of polishing compound semiconductor substrate is conducted. The polishing step (S20) is similar to that of the second embodiment, and description thereof will not be repeated.

Next, a reducing agent step (S50) of polishing or washing compound semiconductor substrate 10/20 using a reducing agent is executed immediately after the polishing step (S20). The reducing agent step (S50) is similar to that of the third embodiment, and description thereof will not be repeated.

Then, an acid-mixed alkaline solution rinsing step (S60) of washing compound semiconductor substrate 10/20 using an acid-mixed alkaline solution of at least 8.0 in pH, having acid ions added, is executed prior to the acid washing step (S30). The acid-mixed alkaline washing step (S60) is similar to that of the third embodiment, and description thereof will not be repeated.

As an alternative to the acid-mixed alkaline washing step (S60), a diluted alkaline washing step (S70) of washing compound semiconductor substrate using a diluted alkaline solution of at least 50 ppm and not more than 0.5% in concentration and at least 8.5 in pH, may be executed. The diluted alkaline washing step (S70) is similar to that of the fourth embodiment, and description thereof will not be repeated. In addition, both the acid-mixed alkaline solution rinsing step (S60) and the diluted alkaline washing step (S70) may be executed.

Then, an acid washing step (S30) of washing compound semiconductor substrate 10/20 using an acid solution including at least one of dilute hydrochloric acid, dilute sulfuric acid, dilute nitric acid, and organic acid is executed. The acid washing step (S30) is similar to that of the second embodiment, and description thereof will not be repeated.

Next, a rinsing step (S80) of washing using HF or HF having hydrogen peroxide solution added may be executed, depending upon the manner of the post-treatment step (S40). In the rinsing step (S80), surface 11 of compound semiconductor substrate 10/20 is terminated at H or F atoms to remove Si. Accordingly, leakage at the interface with the epitaxial layer on the semi-insulative compound semiconductor substrate can be further reduced.

In the rinsing step (S80), HF, or HF having hydrogen peroxide solution added, is used. The pH of HF is preferably 3.0 to 6.5, more preferably 4.0 to 6.0. The concentration of HF is preferably 0.1% to 3%. The concentration of hydrogen peroxide solution is preferably 0.05% to 2%.

Then, a post-treatment step (S40) of growing, on surface 11 of compound semiconductor substrate 10/20, a compound semiconductor crystal including at least one element constituting compound semiconductor substrate 10/20 is executed with respect to compound semiconductor substrate 10/20 subjected to the rinsing step (S80). The post-treatment step (S40) is similar to that of the second embodiment, and description thereof is not repeated.

The surface treatment method of compound semiconductor substrate 10/20 according to the fifth embodiment of the present invention further includes an acid-mixed alkaline washing step (S60) of washing compound semiconductor substrate 10/20 using an acid-mixed alkaline solution of at least 8.0 in pH, having acid ions added, prior to the acid washing step (S30). By executing an acid-mixed alkaline washing step (S60) prior to the acid washing step (S30), foreign objects (microparticles) present at surface 11 of compound semiconductor substrate 10/20, not readily removed in the acid washing step (S30), as well as the abrasive remaining in the polishing step (S20), can be removed. By executing the acid washing step (S30) after the acid-mixed alkaline washing step (S60), the surface roughness Rms of compound semiconductor substrate 10/20 can be further improved.

Preferably in the surface treatment method of compound semiconductor substrate 10/20 set forth above, the acid-mixed alkaline washing step (S60) is executed with an oxidizing agent added to the acid-mixed alkaline solution. Accordingly, the rate of reducing the unevenness at the surface of compound semiconductor substrate in the acid-mixed alkaline washing step (S60) can be improved.

Preferably in the surface treatment method of compound semiconductor substrate 10/20 set forth above, the method further includes a diluted alkaline washing step (S70) of washing compound semiconductor substrate 10/20 using a diluted alkaline solution having a concentration of at least 50 ppm and not more than 0.5%, and at least 8.5 in pH, prior to the acid washing step (S30). By the diluted alkaline solution, foreign objects present at surface 11 of compound semiconductor substrate 10/20, not readily removed in the acid washing step (S30), and the abrasive remaining by the polishing step (S20), can be removed. Therefore, a balance between the washing capability and prevention of asperity in atomic order at the surface can be established.

In the surface treatment method of compound semiconductor substrate 10/20 set forth above, the diluted alkaline washing step (S70) is preferably executed with an oxidizing agent added to the diluted alkaline solution. Accordingly, the rate of reducing the unevenness at the surface of the compound semiconductor substrate can be improved in the diluted alkaline washing step (S70).

Preferably in the surface treatment method of compound semiconductor substrate 10/20 set forth above, the method further includes a reducing agent step (S50) of polishing or washing compound semiconductor substrate 10/20 using a reducing agent, immediately after the polishing step (S20). Accordingly, the action of chlorine that is the oxidizing agent included in the abrasive in the polishing step (S20) can be stopped to suppress the surface asperity. Since a reducing agent that is an economic agent can be used, the energy cost can be reduced significantly as compared to the case where deionized water of low temperature is constantly supplied.

Preferably in the surface treatment method of compound semiconductor substrate 10/20 set forth above, an alkaline aqueous solution or an oxidizing agent aqueous solution having a pH of at least 8.5 and not more than 10.0 is used as the reducing agent in the reducing agent step (S50). Accordingly, the action of chlorine, when included in the abrasive used in the polishing step (S20), is stopped to further suppress surface asperity.

The surface treatment method of compound semiconductor substrate 10/20 set forth above includes further a rinsing step (S80) of rinsing using HF or HF having hydrogen peroxide solution added, after the acid washing step (S30). By terminating surface 11 with H or F atoms, impurities such as silicon as well as oxygen present at surface 11 can be removed. Therefore, the unevenness in atomic order at surface 11 can be reduced, and contamination of the impurities such as silicon can be prevented. Therefore, oxygen atoms and Si atoms at the surface of compound semiconductor substrate 10/20 can be reduced, allowing a device of favorable quality, with little leakage, to be obtained for a high speed device.

EXAMPLE 1

Specimens set forth below were prepared to measure the surface roughness Rms and the oxygen concentration at the surface of the specimen in order to confirm the effect of the inspection method of a compound semiconductor substrate of the present invention. The prepared specimens, measurement method, and measurement result will be described hereinafter.

(Specimen 1)

First, the preparation step (S10) was executed. Specifically, a GaAs single crystal ingot doped with C (carbon), grown by the VB (Vertical Bridgeman) method, was used. The GaAs single crystal ingot was subjected to peripheral chamfering, tilted 0.5° in the <110> direction at the (100) plane, and both sides were ground using a double-sides grinder (product of Hamai Co., Ltd.). Thus, a compound semiconductor substrate was prepared.

Then, the polishing step (S20) was executed. Specifically, both sides of the compound semiconductor substrate were polished with a polishing cloth (SUBA 400 of Rodel Inc.) using a polishing agent ("INSEC", product of Fujimi Incorporated) having colloidal silica (product of Nissan Chemical) added. Next, the compound semiconductor substrate having both sides polished washed with an alkaline washing liquid. Then, a one-side polisher (product of Fujikoshi Machinery Corporation) was used to one-side polish the compound semiconductor substrate with a polishing agent.

Next, the reducing agent step (S50) was executed. Specifically, in order to stop the action of the chlorine immediately after the polishing step (S20), the compound semiconductor substrate was rinsed with sodium thiosulfate aqueous solution as the reducing agent. Next, the compound semiconductor substrate washed with deionized water.

Then, the acid-mixed alkaline washing step (S60) was executed. As the acid-mixed alkaline solution having the pH of at least 8.0, an aqueous solution having the pH adjusted to 10 by introducing droplets of hydrochloric acid into 1% tetramethyl ammonium hydroxide (TMAH) was used. Using the acid-mixed alkaline solution as the washing liquid, ultrasonic waves of 2 MHz was applied using the treatment device of FIG. 4 to remove foreign objects adhering to the surface of the compound semiconductor substrate.

Following the deionized water rinsing step, the acid washing step (S30) was executed. Specifically, the compound semiconductor substrate washed using 0.1% HCl. Then, following the deionized water washing step, the rinsing step (S80) was executed. Specifically, after the compound semiconductor substrate washed with 0.1% HF, rinsing was conducted with ultra deionized water in which the dissolved oxygen was 50 ppb. Then, centrifugal drying was executed for drying. Thus, a compound semiconductor substrate of Specimen 1 was obtained. The compound semiconductor substrate of Specimen 1 was subjected to the surface treatment method of a compound semiconductor substrate of the present invention, in the range of the compound semiconductor substrate of the present invention.

Then, the post-treatment (S40) was executed. Specifically, epitaxial growth was conducted on the compound semiconductor substrate subjected to the rinsing step (S80) by means of an MOCVD (Metal Organic Chemical Vapor Deposition) device to form an epitaxial layer of GaAlAs.

(Specimen 2)

The compound semiconductor substrate of Specimen 2 was prepared in a manner basically similar to that of the method of producing Specimen 1, provided that the acid washing step (S30) and the rinsing step (S80) were not executed. The compound semiconductor substrate of Specimen 2 was implemented according to the surface treatment method of the compound semiconductor substrate of the present invention, in the range of the compound semiconductor substrate of the present invention.

(Specimen 3)

The compound semiconductor substrate of Specimen 3 was prepared in a manner basically similar to that of the method of producing Specimen 1, provided that the reducing agent step (S50), introduction of droplets of hydrochloric acid in the acid-mixed alkaline washing step (S60), the acid washing step (S30), and the rinsing step (S80) were not carried out. The compound semiconductor substrate of Specimen 3 was produced, different from the surface treatment method of a compound semiconductor substrate of the present invention, and outside the range of the compound semiconductor substrate of the present invention.

(Specimen 4)

The compound semiconductor substrate of Specimen 4 was prepared in a manner basically similar to that of the method of producing Specimen 1, provided that the reducing agent step (S50), introduction of droplets of hydrochloric acid in the acid-mixed alkaline washing step (S60), and the acid washing step (S30), were not carried out. The compound semiconductor substrate of Specimen 4 was produced, different from the surface treatment method of a compound semiconductor substrate of the present invention, and outside the range of the compound semiconductor substrate of the present invention.

(Specimen 5)

The compound semiconductor substrate of Specimen 5 was prepared in a manner basically similar to that of the method of producing Specimen 1, provided that the reducing agent step (S50), the acid washing step (S30), and the rinsing step (S80) were not carried out. The compound semiconductor substrate of Specimen 5 was produced, different from the surface treatment method of a compound semiconductor substrate of the present invention, and outside the range of the compound semiconductor substrate of the present invention.

(Measurement Method)

The surface roughness Rms was measured for each of Specimens 1-5 in the scope of 10 μm square, 1 μm square, and 0.2 μm square. Specifically, the surface roughness of the compound semiconductor substrate subsequent to the rinsing step (S80) was measured for samples of 512 lines, 512 samples per line, at the pitch of 0.38 nm by means of an AFM ("Dimension 3000" of Veeco Instruments Inc.). At the measurement stage, the tapping mode was employed. The surface roughness Rms was obtained from the measurement results.

The amount of O (oxygen), qualified as impurities, was measured at the interface between the compound semiconductor substrate subjected to the post-treatment step (S40) and the epitaxial layer for Specimens 1-5. Specifically, attention was directed to the compound semiconductor crystal obtained by executing the post-treatment step (S40). The magnetic type secondary ion mass spectrometer (SIMS) of CAMECA was used at the interface between the former compound semiconductor substrate and the epitaxial layer. Sputtering was conducted with Cs ions from the surface side of the epitaxial layer. The output secondary ions were counted with the analyzer to measure the amount of O (unit: atoms/cm$^3$).

(Result of Measurement)

Figure 7:
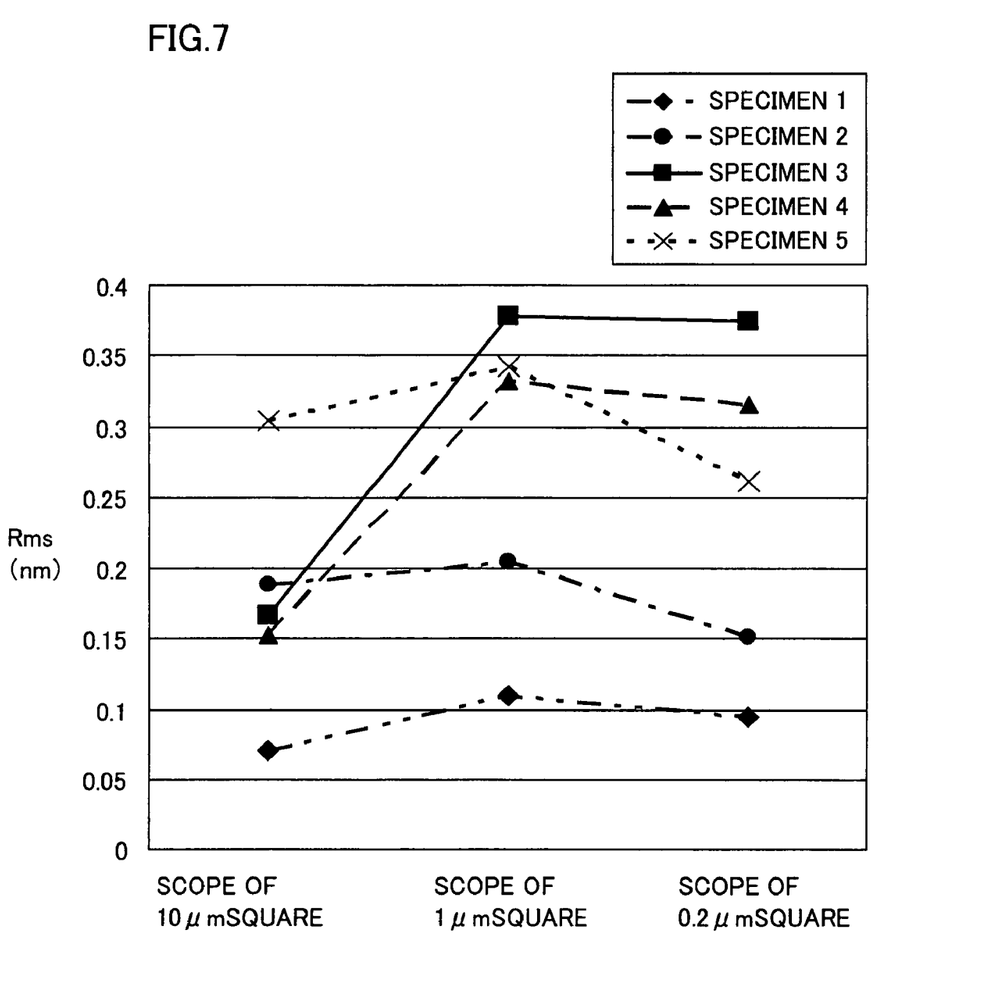
FIG. 7 is a diagram representing the relationship between the size of a scope and the surface roughness Rms.

The measurement results are shown in Table 1 set forth below and FIG. 7. In FIG. 7, the surface roughness Rms (unit: nm) of the compound semiconductor substrate is plotted along the vertical axis, whereas the size of the measured scope is plotted along the horizontal axis.

TABLE 1

| | Scope of 10 μm Square Rms (nm) | Scope of 1 μm Square Rms (nm) | Scope of 0.2 μm Square Rms (nm) | O Amount at Interface atoms/cm$^3$ |
|---|---|---|---|---|
| Specimen 1 | 0.070 | 0.110 | 0.095 | $1.0 \times 10^{17}$ |
| Specimen 2 | 0.189 | 0.205 | 0.152 | $2.0 \times 10^{17}$ |
| Specimen 3 | 0.166 | 0.378 | 0.375 | $2.0 \times 10^{18}$ |
| Specimen 4 | 0.153 | 0.332 | 0.316 | $2.0 \times 10^{18}$ |
| Specimen 5 | 0.304 | 0.342 | 0.261 | $1.0 \times 10^{18}$ |

It is appreciated from Table 1 and FIG. 7 that the amount of O at the interface with the compound semiconductor substrate became lower in proportion to a lower surface roughness Rms measured at the scope of 0.2 μm square. It is also appreciated that the surface roughness Rms measured at the scopes of 1 μm square and 10 μm square did not necessarily correlate with the amount of O of the compound semiconductor substrate. In other words, the amount of O is not low even if the surface roughness Rms was low, measured in the scope of 1 μm square and 10 μm square.

According to Example 1, it was confirmed that the impurity concentration at the surface of the compound semiconductor substrate is low when the surface roughness Rms measured at the scope within the 0.2 μm square is low.

EXAMPLE 2

Specimens set forth below were prepared to measure the impurity concentration at the surface of the specimen in order to confirm the advantage of the compound semiconductor substrate and the surface treatment method of the present invention.

(Production of Specimen in Example 2)

First, the preparation step (S10) was executed. Specifically, an InP single crystal ingot was used with the LEC method (Liquid Encapsulated Czochralaski method). This InP single crystal ingot was sliced with an inner perimeter blade slicer to obtain the InP single crystal. The perimeter of the InP single crystal wafer was shaped and subjected to double-sides lapping, following by etching.

Next, the polishing step (S20) was executed. Specifically, the compound semiconductor substrate prepared in the preparation step (S10) was attached to a ceramic polishing plate. The compound semiconductor substrate was subjected to primary polishing using a hard polishing cloth ("SUBA 600" of Rodel Incorporation). Then, using a suede polishing cloth, the compound semiconductor substrate was subjected to secondary polishing with an acid chlorine type polishing agent (product of Fujimi Incorporated) having colloidal silica (product of Fuso Chemical Co., Ltd.), chlorinated cyanuric acid salt (product of Nissan Chemical Industries, Ltd.) and organic acid salt (product of Kanto Chemical Co., Ltd.).

Then, the acid washing step (S30) was executed. Specifically, 0.3% dilute sulfuric acid was used as the acid solution.

According to the measurement of the surface roughness Rms of the specimen obtained as described above, the Rms was 0.15 nm. Thus, the compound semiconductor substrate of Example 2 was obtained.

Next, the post-treatment step (S40) was executed. Specifically, epitaxial growth was effected on the compound semiconductor substrate subsequent to the acid washing step (S30) with an MOCVD device to form an epitaxial layer of GaAlAs.

(Production of Specimen of Comparative Example 1)

Comparison Example 1 was produced in a manner basically similar to the production of the specimen of Example 2, provided that the acid washing step (S30) was not executed, and washing was executed using alkaline 2.5% TMAH aqueous solution as the washing liquid. The surface roughness Rms of the obtained specimen was measured with an AFM (Dimension 5000) of Veeco Instruments Inc. The Rms was 0.25 nm. Thus, the compound semiconductor substrate of Comparative Example 1 was obtained.

(Measurement Method)

Likewise Example 1, the amount of oxygen at the interface between the surface of the compound semiconductor substrate and the epitaxial grown layer was analyzed with SIMS for each specimen, subsequent to execution of the post-treatment step (S40).

(Measurement Result)

The amount of oxygen of Comparative Example 1 was $2 \times 10^{18}$ atoms/cm$^3$, which is high. In contrast, the oxygen amount of the compound semiconductor substrate of Example 2 was $3 \times 10^{17}$ atoms/cm$^3$, lower than that of Comparative Example 1.

It was confirmed that surface roughness Rms can be lowered to not more than 0.2 nm in Example 2 of the present invention by executing the acid washing step (S30). It was also confirmed that the amount of impurities can be reduced by setting the surface roughness Rms to not more than 0.2 nm.

EXAMPLE 3

Specimens set forth below were prepared and the impurity concentration at the specimen surface was measured in order to confirm the effect of the compound semiconductor substrate and surface treatment method of the present invention. The measurement method is similar to that of Example 2.

(Production of Specimen in Example 3)

With regards to the specimen of Example 3, the preparation step (S10) was executed, similar to that of Specimen 1 of Example 1. Then, immediately after executing the polishing step (S20) with a hypochlorous acid type abrasive, 0.1% hydrogen peroxide solution was showered on the compound semiconductor substrate as the reducing agent to execute the reducing agent step (S50) of reducing the oxidizing agent of the abrasive. Then, the acid-mixed alkaline washing step (S60) was executed with 1% ammonia solution.

(Production of Specimen of Example 2)

The specimen of Comparative Example 2 was absent of the reducing agent step (S50) and the acid-mixed alkaline polishing step (S60), and washing with an alkaline washing liquid of high concentration was executed. Specifically, washing was executed with deionized water after the polishing step (S20) in Comparative Example 2. The reducing agent step (S50) was skipped, and the compound semiconductor substrate was washed with 1% tetramethyl ammonium hydroxide (TMAH) of pH 12. The measured surface roughness Rms of the specimen obtained subsequent to execution of the rinsing step (S80) was 0.35 nm. Thus, the compound semiconductor substrate of Comparative Example 2 was obtained.

(Measurement Result)

The amount of impurities of the compound semiconductor substrate of Comparative Example 2 was $2\times10^{18}$ atoms/cm$^3$, which is high. The surface roughness Rms of the compound semiconductor substrate of Example 3 was 0.1 nm, and the amount of impurities was $1\times10^{17}$ atoms/cm$^3$, greatly reduced than that of Comparative Example 2.

According to Example 3 of the present invention, it was confirmed that the surface roughness Rms can be set to 0.2 nm or below by virtue of execution of the reducing agent step (S50) and the acid-mixed alkaline solution rinsing step (S60). By setting the surface roughness Rms to 0.2 nm and below, confirmation was made that the amount of impurities can be reduced.

EXAMPLE 4

Specimens set forth below were prepared and the impurity concentration at the specimen surface was measured in order to confirm the effect of the compound semiconductor substrate and surface treatment method of the present invention. The measurement method is similar to that of Example 2.

(Production of Specimen of Example 4)

First, the preparation step (S10) was executed. Specifically, a GaN substrate grown by HVPE (Hydride Vapor Phase Epitaxy) was used. The perimeter of the GaN substrate was chamfered and subjected to surface grinding with a diamond grindstone.

Then, the polishing step (S20) was executed. Specifically, the surface of the GaN substrate was subjected to primary polishing with diamond paste. Next, the surface was subjected to secondary polishing with an acid colloidal silica abrasive solution having an oxidizing agent of hypochlorous acid soda. After the primary polishing and secondary polishing, the reducing agent step (S50) was executed with 0.5% hydrogen peroxide solution. Then, the substrate washed with organic acid.

Using diluted alkaline solution as the washing liquid, the diluted alkaline washing step (S70) was executed. Specifically, 0.3% choline was used as the diluted alkaline solution. Next, the acid washing step (S30) was executed. Specifically, 0.5% dilute sulfuric acid having hydrogen peroxide solution added was used as the acid solution.

The measured surface roughness Rms of the specimen obtained as set forth above was 0.1 nm. Thus, the compound semiconductor substrate of Example 4 was obtained.

Subsequently, the post-treatment step (S40) was executed. Specifically, epitaxial growth was effected on the compound semiconductor substrate subsequent to the acid washing step (S30) with an MOCVD device to form an epitaxial layer of AlGaAs.

(Production of Specimen of Comparative Example 3)

The specimen of Comparative Example 3 was obtained by washing with a diluted alkaline solution similar to that of Example 4 without executing the reducing agent step (S50) immediately after the polishing step (S20). (The diluted alkaline washing step (S70) was executed). It is to be noted that the acid washing step (S30) was not executed. The measured surface roughness Rms of the specimen obtained as set forth above was 0.4 nm. Thus, the compound semiconductor substrate of Comparative Example 3 was obtained.

(Measurement Result)

The amount of oxygen of the compound semiconductor substrate of Comparative Example 3 was $5\times10^{18}$ atoms/cm$^3$, which is high. The amount of oxygen of the compound semiconductor substrate of Example 4 was $3\times10^{17}$ atoms/cm$^3$, significantly reduced than that of Comparative Example 3.

It was confirmed that the surface roughness Rms can be set to 0.2 nm and below by executing the reducing agent step (S50), the diluted alkaline washing step (S70), and the acid washing step (S30) in Example 4. It is also confirmed that the amount of impurities can be reduced by setting the surface roughness Rms to not more than 0.2 nm.

EXAMPLE 5

Specimens set forth below were prepared and the surface roughness Rms at the specimen surface was measured in order to confirm the effect of the surface treatment method of the present invention. The measurement method is similar to that of Example 2.

First, the preparation step (S10) was executed. Specifically, an n-type GaAs substrate grown by BB (Horizontal Bridgeman method) was prepared. Then, the polishing step (S20) was executed. Specifically, polishing was executed with a polishing agent including isoscyanuric acid salt. Next, the reducing agent step (S50) was executed. Polishing was executed for one minute using 0.1% hydroxylation 2-hydroxyethyl-trimethyl ammonium aqueous solution as the reducing agent. Subsequently, the diluted alkaline washing step (S70) was executed. Specifically, washing through ultrasonic wave was executed using 0.5% hydroxylation 2-hydroxyethyl-trimethyl ammonium aqueous solution. Thus, the compound semiconductor substrate of Example 5 was obtained. The measured surface roughness Rms of the obtained compound semiconductor substrate was 0.15 nm.

EXAMPLE 6

Specimens set forth below were prepared and the surface roughness Rms at the specimen surface was measured in order to confirm the effect of the surface treatment method of the present invention. The measurement method is similar to that of Example 2.

The specimen of Example 6 is basically similar to the specimen of Example 5, provided that washing through ultrasonic wave with 0.1% hydrogen peroxide solution added was executed in the diluted alkaline washing step (S70). The measured surface roughness Rms of the obtained compound semiconductor substrate was 0.17 nm.

EXAMPLE 7

Specimens set forth below were prepared and the surface roughness Rms at the specimen surface was measured in order to confirm the effect of the surface treatment method of the present invention. The measurement method is similar to that of Example 2.

First, the preparation step (S10) was executed. Specifically, an n-type GaAs substrate grown by LEC was prepared. Then, the polishing step (S20) was executed. Specifically, polishing was executed with an abrasive including sodium hypochlorous acid as the reducing agent. Subsequently, the reducing agent step (S50) was executed. Specifically, 0.05% trimethyl hydroxide aqueous solution was sprayed as the reducing agent onto the compound semiconductor substrate immediately after polishing. Then, the acid-mixed alkaline washing step (S60) was executed. Specifically, washing through ultrasonic wave was executed in an aqueous solution having the pH adjusted to 8.5 by adding 1.5% ammonia aqueous solution into sulfuric acid. The measured surface roughness Rms of the obtained compound semiconductor substrate was 0.11 nm.

EXAMPLE 8

Specimens set forth below were prepared and the surface roughness Rms at the specimen surface was measured in order to confirm the effect of the surface treatment method of the present invention. The measurement method is similar to that of Example 2.

The specimen of Example 8 is basically similar to the specimen of Example 7, provided that washing through ultrasonic wave was executed having 0.2% hydrogen peroxide solution added in the acid-mixed alkaline washing step (S60). The measured surface roughness Rms of the obtained compound semiconductor substrate was 0.14 nm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface treatment method of a compound semiconductor substrate to obtain the compound semiconductor substrate comprising:
    a step of preparing a compound semiconductor substrate,
    a step of polishing said compound semiconductor substrate,
    a step of washing said compound semiconductor substrate using an acid-mixed alkaline solution of at least 8.0 in pH, having acid ions added, and
    a step of washing said compound semiconductor substrate using an acid solution formed of at least one of dilute hydrochloric acid, dilute sulfuric acid, dilute nitric acid, and organic acid, after said step of polishing and said step of rinsing using said acid-mixed alkaline solution wherein the compound semiconductor substrate comprising: at least one of GaAs, InP, GaN, and InN; and a surface roughness Rms of not more than 0.2 nm, the surface roughness measured by an atomic force microscope at a pitch of not more than 0.4 nm in a scope of not more than 0.2 pm square.

2. The surface treatment method of a compound semiconductor substrate according to claim 1, wherein said step of washing using an acid solution is executed with an oxidizing agent added to said acid solution.

3. The surface treatment method of a compound semiconductor substrate according to claim 1, wherein said step of washing using an acid-mixed alkaline solution is executed with an oxidizing agent added to said acid-mixed alkaline solution.

4. The surface treatment method of a compound semiconductor substrate according to claim 1, further comprising a step of washing said compound semiconductor substrate using a diluted alkaline solution of at least 50 ppm and not more than 0.5% in concentration, and at least 8.5 in pH, prior to said step of washing using an acid solution.

5. The surface treatment method of a compound semiconductor substrate according to claim 4, wherein said step of washing using a diluted alkaline solution is executed with an oxidizing agent added to said diluted alkaline solution.

6. The surface treatment method of a compound semiconductor substrate according to claim 1, further comprising a step of polishing or washing said compound semiconductor substrate using a reducing agent, immediately after said step of polishing.

7. The surface treatment method of a compound semiconductor substrate according to claim 6, wherein an alkaline aqueous solution or oxidizing agent aqueous solution having a pH of at least 8.5 and not more than 10.0 is used as said reducing agent in said step of polishing or washing using a reducing agent.

8. The surface treatment method of a compound semiconductor substrate according to claim 1, further comprising a step of washing said compound semiconductor substrate using HF or HF having hydrogen peroxide solution added, after said step of washing using an acid solution.

9. A method of producing a compound semiconductor crystal, comprising:
    a step of executing the surface treatment method of a compound semiconductor substrate defined in claim 1, and
    a step of growing, on the surface of said compound semiconductor substrate, a compound semiconductor crystal including at least one element constituting said compound semiconductor substrate, after said step of executing the surface treatment method.

10. A surface treatment method of a compound semiconductor substrate to obtain the compound semiconductor substrate comprising:
    a step of preparing a compound semiconductor substrate,
    a step of polishing said compound semiconductor substrate,
    a step of polishing or washing said compound semiconductor substrate using a reducing agent, immediately after said step of polishing, and
    a step of washing said compound semiconductor substrate using an acid-mixed alkaline solution of at least 8.0 in pH, having acid ions added, after said step of polishing or washing using a reducing agent wherein the compound semiconductor substrate comprising: at least one of GaAs, InP, GaN, and InN; and a surface roughness Rms of not more than 0.2 nm, the surface roughness measured by an atomic force microscope at a pitch of not more than 0.4 nm in a scope of not more than 0.2 pm square.

11. The surface treatment method of a compound semiconductor substrate according to claim 10, wherein said step of washing using an acid-mixed alkaline solution is executed with an oxidizing agent added to said acid-mixed alkaline solution.

12. A surface treatment method of a compound semiconductor substrate to obtain the compound semiconductor substrate comprising:
    a step of preparing a compound semiconductor substrate,
    a step of polishing said compound semiconductor substrate,
    a step of polishing or washing said compound semiconductor substrate using a reducing agent, immediately after said step of polishing, and
    a step of washing said compound semiconductor substrate using a diluted alkaline solution of at least 50 ppm and not more than 0.5% in concentration, and at least 8.5 in pH, after said step of polishing or washing using a reducing agent wherein the compound semiconductor substrate comprising: at least one of GaAs, InP, GaN, and InN; and a surface roughness Rms of not more than 0.2 nm, the surface roughness measured by an atomic force microscope at a pitch of not more than 0.4 nm in a scope of not more than 0.2 pm square.

13. The surface treatment method of a compound semiconductor substrate according to claim 12, wherein said step of washing using a diluted alkaline solution is executed with an oxidizing agent added to said diluted alkaline solution.

* * * * *